(12) United States Patent
Tanaka et al.

(10) Patent No.: US 6,853,065 B2
(45) Date of Patent: Feb. 8, 2005

(54) TAB TAPE, METHOD OF MAKING SAME AND SEMICONDUCTOR DEVICE

(75) Inventors: Hiroki Tanaka, Tokyo (JP); Hiroshi Ishikawa, Tokyo (JP); Nagayoshi Matsuo, Tokyo (JP)

(73) Assignee: Hitachi Cable, Ltd. (JP)

( * ) Notice: Subject to any disclaimer, the term of this patent is extended or adjusted under 35 U.S.C. 154(b) by 0 days.

(21) Appl. No.: 10/647,922

(22) Filed: Aug. 26, 2003

(65) Prior Publication Data

US 2004/0036158 A1 Feb. 26, 2004

(30) Foreign Application Priority Data

Aug. 26, 2002 (JP) ........................................ 2002-244862

(51) Int. Cl.[7] .............................................. H01L 23/04
(52) U.S. Cl. ...................................... 257/698; 257/783
(58) Field of Search ................................ 257/698, 700, 257/701, 702, 703, 758, 782, 783; 438/125, 118, 119

(56) References Cited

U.S. PATENT DOCUMENTS

| 5,409,865 | A | * | 4/1995 | Karnezos ..................... 29/827 |
| 5,420,460 | A | * | 5/1995 | Massingill ................... 257/693 |
| 5,844,168 | A | * | 12/1998 | Schueller et al. .......... 174/52.4 |
| 6,259,154 | B1 | * | 7/2001 | Niwa ........................... 257/678 |
| 6,436,733 | B2 | * | 8/2002 | Yukawa ....................... 438/118 |
| 6,509,643 | B2 | * | 1/2003 | Ohtaka et al. .............. 257/712 |
| 6,621,160 | B2 | * | 9/2003 | Shibamoto et al. ......... 257/712 |
| 6,696,764 | B2 | * | 2/2004 | Honda ......................... 257/778 |
| 6,734,535 | B1 | * | 5/2004 | Hashimoto .................. 257/668 |

FOREIGN PATENT DOCUMENTS

| JP | 2001-110936 | * | 4/2001 |
| JP | 2002-16175 | * | 1/2002 |
| JP | 2000-311720 | * | 4/2002 |
| JP | 2002-118217 | * | 4/2002 |
| JP | 2002-124549 | * | 4/2002 |

* cited by examiner

Primary Examiner—S. V. Clark
(74) Attorney, Agent, or Firm—James B. Conte; Barnes & Thornburg LLP

(57) ABSTRACT

A TAB tape has: a tape substrate of insulating material; a first wiring pattern of conductive material, the first wiring pattern being formed on one surface of the tape substrate; a second wiring pattern of conductive material, the second wiring pattern being formed on the other surface of the tape substrate; a conduction part that allows electrical conduction between the first wiring pattern and the second wiring pattern; and a stiffener that is adhered through adhesive to the other surface of the tape substrate. In the TAB tape, the second wiring pattern includes an insulating material filled in a groove region where no wiring pattern is formed around wiring patterns of the second wiring pattern.

9 Claims, 8 Drawing Sheets

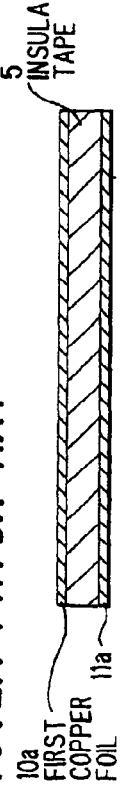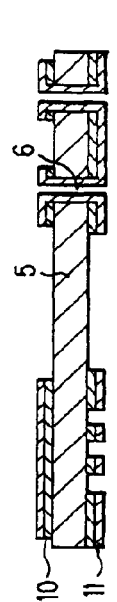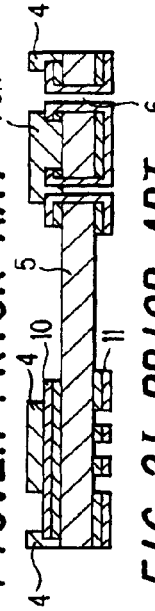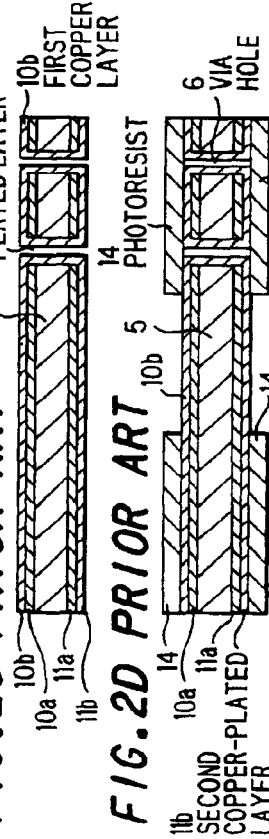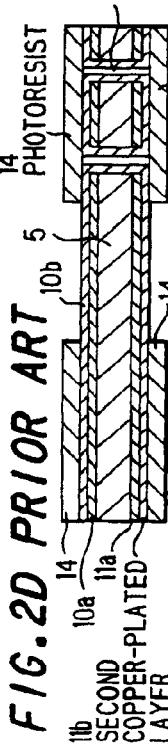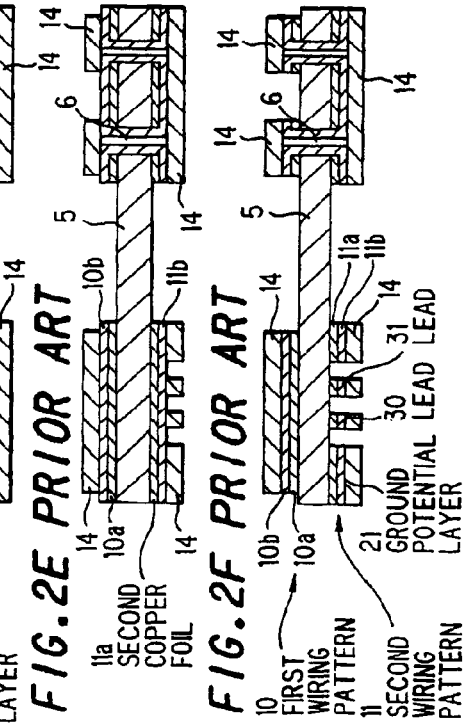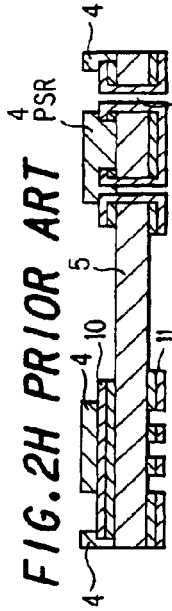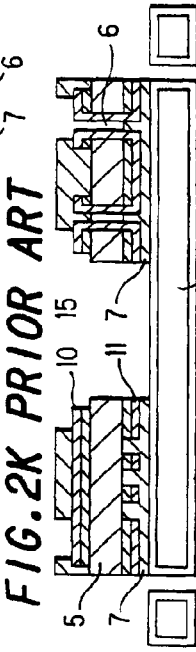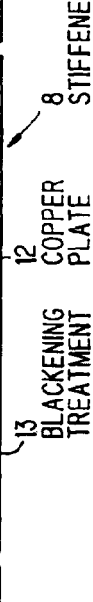

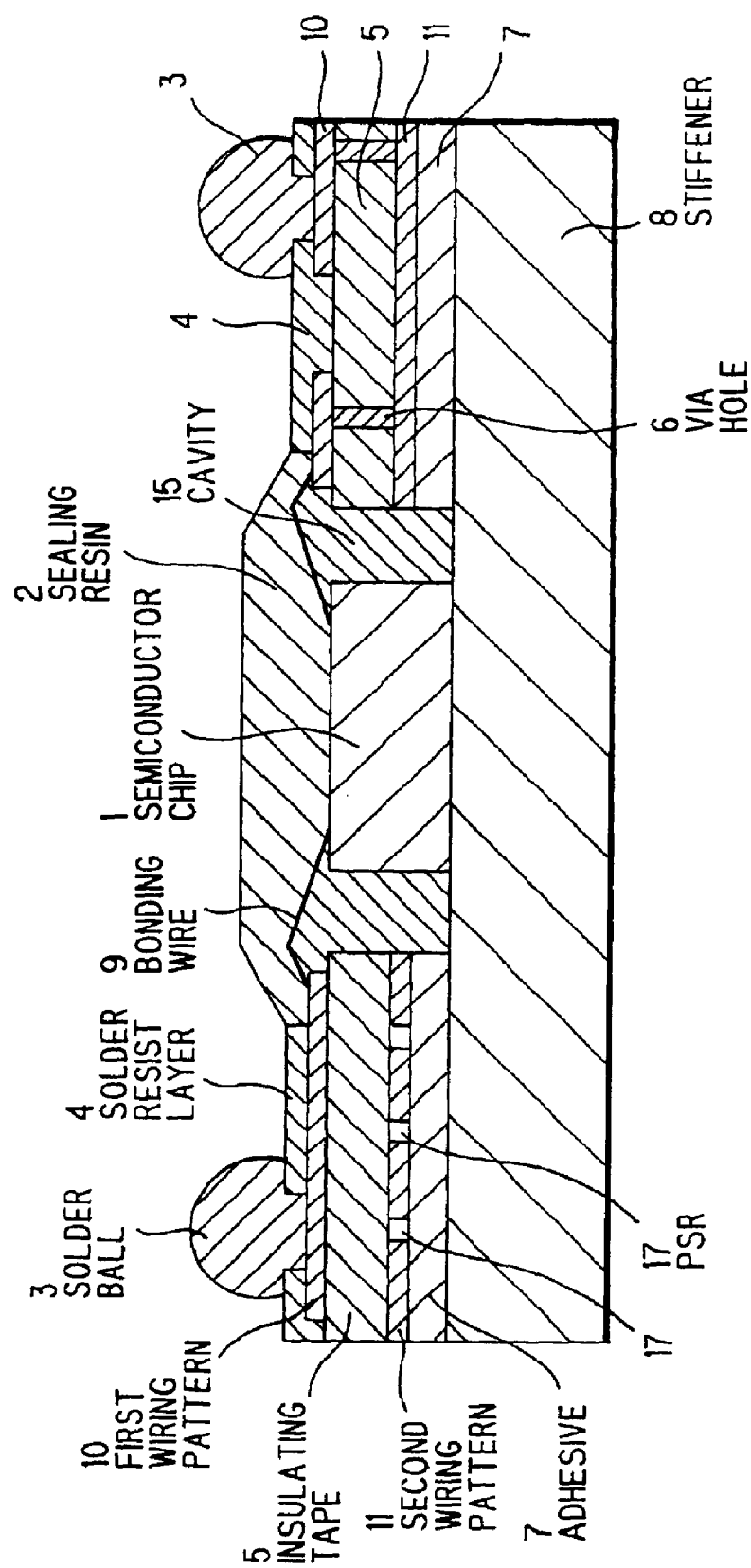

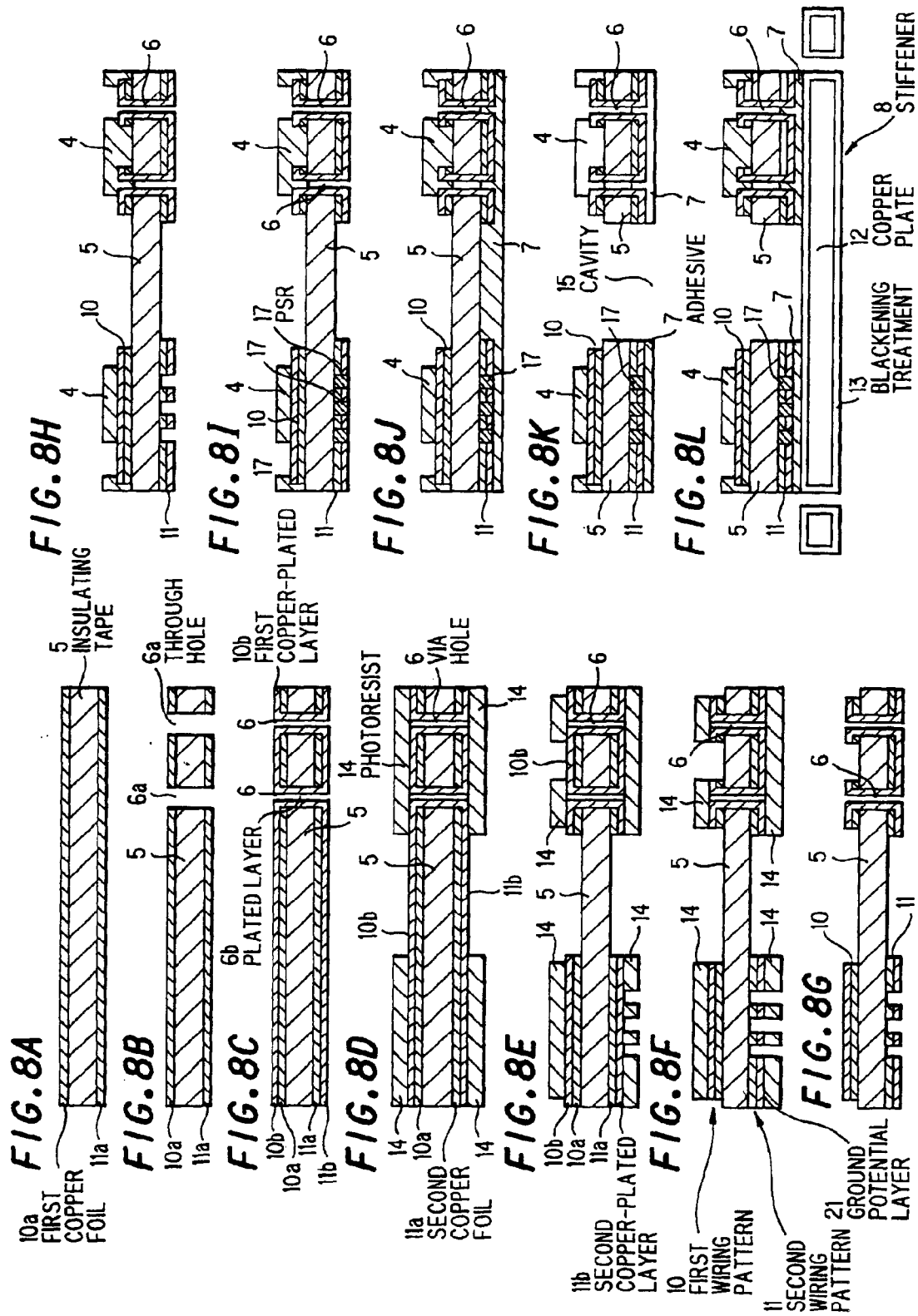

TAB TAPE, METHOD OF MAKING SAME AND SEMICONDUCTOR DEVICE

The present application is based on Japanese patent application No. 2002-244862, the entire contents of which are incorporated herein by reference.

BACKGROUND OF THE INVENTION

1. Field of the Invention

This invention relates to a TAB (tape automated bonding) tape with a stiffener as radiation and reinforcement plate, a method of making the same, and a tape BGA (ball grid array) semiconductor device using the TAB tape.

2. Description of the Related Art

Tape BGA semiconductor devices are used for sever control of communication device etc. The tape BGA semiconductor device is required to operate at a high-frequency region of tens of GHz according to increase in transmission speed. Thus, it needs characteristics such as high radiation and low noise. Because of this, the tape substrate used is a double-sided wiring tape where ground potential layer and signal wiring layer are separated, and a stiffener of copper alloy etc. with a good radiation performance is adhered to the tape through adhesive.

FIG. 1 shows a conventional tape BGA semiconductor device. The tape BGA semiconductor device is composed of: an insulating tape 5 of, e.g., polyimide with flexibility; a first wiring pattern 10 that is formed on the surface of insulating tape 5; a second wiring pattern 11 that is formed on the back surface of insulating tape 5; via holes 6 that are provided in the insulating tape 5 to allow electrical conduction between the first and second wiring patterns 10, 11, a stiffener 8 that is adhered under the insulating tape 5 through adhesive 7; a semiconductor chip 1 that is mounted on the stiffener 8 in a cavity 15; bonding wires 9 that connect between electrodes (not shown) of the semiconductor chip 1 and terminals (not shown) of the first wiring pattern 10; and solder balls 3 that are connected with the first wiring pattern 10 and are used as electrodes to connect with an external circuit (not shown).

The semiconductor chip 1 and the bonding wires 9 are sealed with sealing resin 2. PSR (photosensitive solder resist) layer 4 is formed on the first wiring pattern 10 side, except regions that the solder balls 3 are mounted and the sealing resin 2 is provided, to prevent a deviation in shape of solder ball or a short circuit between solder balls when mounting the solder balls.

The first wiring pattern 10 is used mainly as signal layer, and the second wiring pattern 11 is, as described later, composed of ground potential layer and leads.

A method of making the above tape BGA semiconductor device will be described below.

FIGS. 2A to 2K show a process of making the conventional tape BGA semiconductor device with stiffener. FIGS. 3A to 3C show a process of making the stiffener 8 in FIG. 1.

At first, a copper-covered substrate is prepared that first and second copper foils 10a and 11a are adhered to both surfaces of insulating tape 5 of polyimide film etc. (FIG. 2A). Then, through-holes 6a are formed by punching (FIG. 2B). Both surfaces of the copper-covered substrate with through-holes 6a are copper-plated (FIG. 2C). Via hole 6 is formed that copper-plated layer 6b allows electrical conduction between the first copper foil 10a and the second copper foil 11a, and first and second copper-plated layers 10b and 11b are formed on the first and second copper foils 10a and 11a.

Then, photoresist 14 with a predetermined pattern is coated (FIG. 2D). By conducting the exposure and development, portions where no wiring pattern is to be formed in the first and second copper-plated layer 10b, 11b are exposed (FIG. 2E). The exposed first and second copper-plated layer 10b, 11b and the exposed first and second copper foils 10a, 11a are removed by etching to form the first and second wiring patterns 10, 11 (FIG. 2F). At that time, leads 30, 31 and ground potential layer 21 are also formed in the second wiring pattern 11.

Photoresist 14 is removed (FIG. 2G). On a suitable place of the first copper foil 10a side, PSR 4 is coated that prevents a deviation in shape of solder ball or a short circuit between solder balls when mounting the solder balls (FIG. 2H).

Then, adhesive 7 is coated on the second wiring pattern 11 side (FIG. 2I). A cavity 15 is formed that houses the semiconductor chip (FIG. 2J). The stiffener 8 is adhered to the back surface of the insulating tape 5 (FIG. 2K). Then, by thermally curing the adhesive 7, the TAB tape with stiffener is obtained.

The stiffener 8 is prepared as follows. A copper plate 12 (FIG. 3A) is shaped to have a given pattern by pressing or punching (FIG. 3B). Then, it is subject to blackening treatment 13 so as to enhance the adhesiveness with adhesive 7 (FIG. 3C).

The semiconductor chip 1 is mounted on the stiffener 8 of TAB tape thus obtained on the cavity 15 side. Electrodes (not shown) of the semiconductor chip 1 is connected through the bonding wires 9 with the first wiring pattern 10. Then, the semiconductor chip 1 and bonding wires 9 are sealed with sealing resin 2.

By mounting solder balls 3 at a predetermined position of the first wiring pattern 10, the tape BGA semiconductor device is obtained (FIG. 1).

However, in the conventional TAB tape with stiffener, as shown in FIGS. 4A and 4B, void 16 may occur in the surface where the stiffener 8 is adhered through adhesive 7 since the adhesive 7 is not necessarily enough provided into parts 32, 33 and 34 where no lead is formed in the second wiring pattern 11 or the adhesive itself includes air bubble. Because of this, there is a problem that there may occur peeling of copper layer of the leads 30, 31 in second wiring pattern 11 from the stiffener 8 and migration thereof due to expansion of void in the reflow of solder ball.

SUMMARY OF THE INVENTION

It is an object of the invention to provide a TAB tape that peeling of leads in the second wiring pattern from the stiffener and migration thereof can be prevented in the reflow of solder ball.

It is another object of the invention to provide a method of making a TAB tape that peeling of leads in the second wiring pattern from the stiffener and migration thereof can be prevented in the reflow of solder ball.

It is a further object of the invention to provide a tape BGA semiconductor device that peeling of leads in the second wiring pattern from the stiffener and migration thereof can be prevented.

According to a first aspect of the invention, a TAB tape comprises:

a tape substrate of insulating material;

a first wiring pattern of conductive material, the first wiring pattern being formed on one surface of the tape substrate;

a second wiring pattern of conductive material, the second wiring pattern being formed on the other surface of the tape substrate;

a conduction part that allows electrical conduction between the first wiring pattern and the second wiring pattern; and a stiffener that is adhered through adhesive to the other surface of the tape substrate;

wherein the second wiring pattern includes an insulating material filled in a groove region where no wiring pattern is formed around wiring patterns of the second wiring pattern.

According to a second aspect of the invention, a method of making a TAB tape comprises the steps of:

forming a first wiring pattern of conductive material on one surface of a tape substrate of insulating material;

forming a second wiring pattern of conductive material on the other surface of the tape substrate;

forming a conduction part that allows electrical conduction between the first wiring pattern and the second wiring pattern; and adhering a stiffener through adhesive to the other surface of the tape substrate;

wherein the adhering step is conducted after filling an insulating material in a groove region where no wiring pattern is formed around wiring patterns of the second wiring pattern.

According to a third aspect of the invention, a semiconductor device comprises:

a tape substrate of insulating material, the tape substrate including an opening;

a first wiring pattern of conductive material, the first wiring pattern being formed on one surface of the tape substrate;

a second wiring pattern of conductive material, the second wiring pattern being formed on the other surface of the tape substrate;

a conduction part that allows electrical conduction between the first wiring pattern and the second wiring pattern; and a stiffener that is adhered through adhesive to the other surface of the tape substrate;

a semiconductor chip that is mounted on the stiffener in the opening of the tape substrate;

bonding wires that connect between the semiconductor chip and the second wiring pattern; and sealing resin that seals the semiconductor chip;

wherein the second wiring pattern includes an insulating material filled in a groove region where no wiring pattern is formed around wiring patterns of the second wiring pattern.

BRIEF DESCRIPTION OF THE DRAWINGS

The preferred embodiments according to the invention will be explained below referring to the drawings, wherein:

FIGS. 2A to 2K are cross sectional views showing the process of making the conventional tape BGA semiconductor device with stiffener;

FIG. 5 is a cross sectional view showing a tape BGA semiconductor device in a preferred embodiment according to the invention;

FIGS. 8A to 8L are cross sectional views showing the process of making a tape BGA semiconductor device with stiffener in the preferred embodiment according to the invention.

DETAILED DESCRIPTION OF THE PREFERRED EMBODIMENTS

Figure 1:
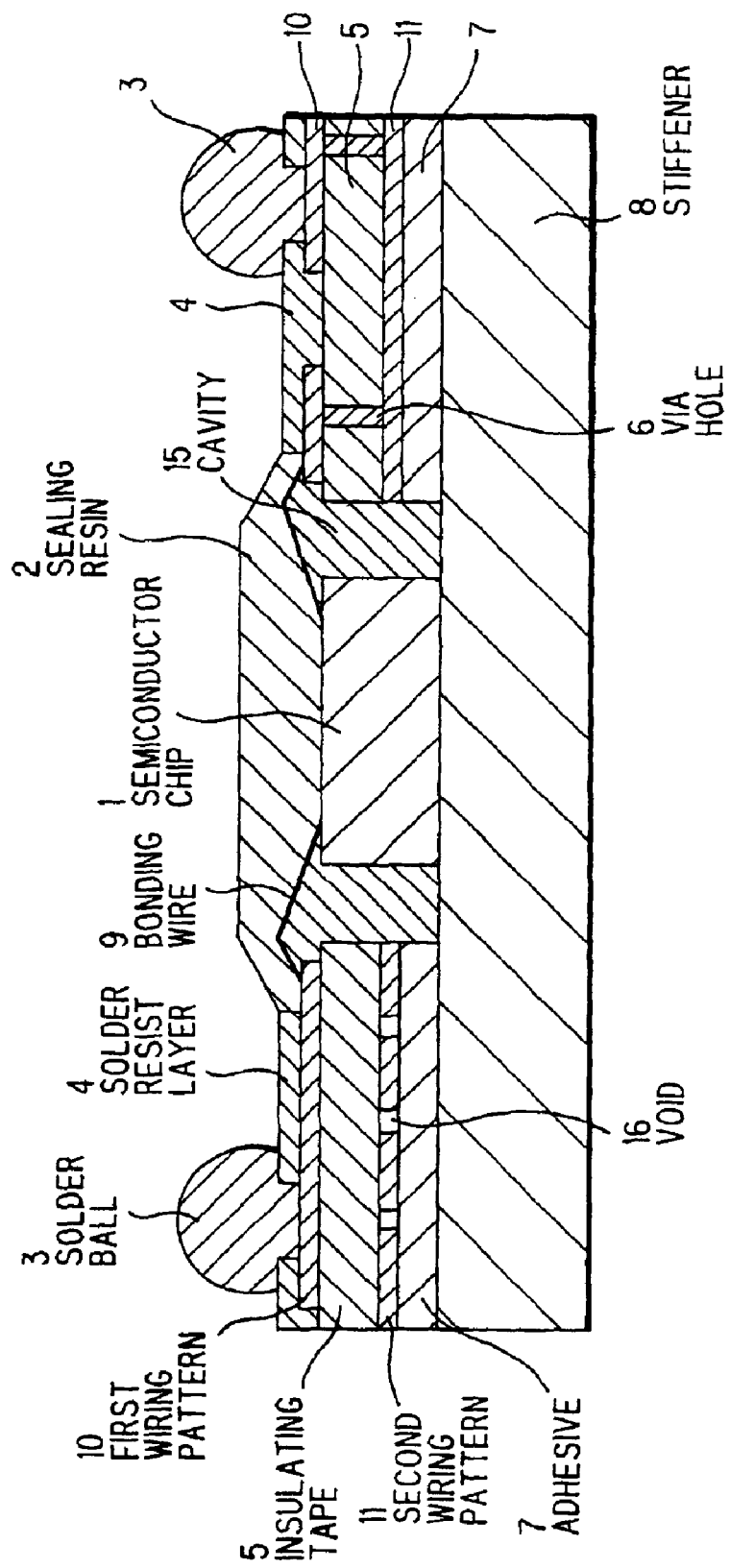
FIG. 1 is a cross sectional view showing the conventional tape BGA semiconductor device with stiffener.

FIG. 5 is a cross sectional view showing a tape BGA semiconductor device in the preferred embodiment according to the invention. In FIG. 5, same numerals are used for same components as those in FIG. 1.

The tape BGA (ball grid array, herein referred to as BGA) semiconductor device is composed of: an insulating tape 5 of, e.g., polyimide with flexibility; a first wiring pattern 10 that is formed on the surface of insulating tape 5; a second wiring pattern 11 that is formed on the back surface of insulating tape 5; via holes 6 that are provided in the insulating tape 5 to allow electrical conduction between the first and second wiring patterns 10, 11, a stiffener 8 that is adhered to the back surface of the insulating tape 5 through adhesive 7; a semiconductor chip 1 that is mounted on the stiffener 8 in a cavity 15; bonding wires 9 that connect between electrodes (not shown) of the semiconductor chip 1 and terminals (not shown) of the first wiring pattern 10; and solder balls 3 that are connected with the first wiring pattern 10 and are used as electrodes to connect with an external circuit (not shown).

There is provided PSR (photosensitive solder resist, herein referred to as PSR) 17 between wirings in the second wiring pattern 11, i.e., regions where no copper layer exists in the second wiring pattern 11.

The semiconductor chip 1 and the bonding wires 9 are sealed with sealing resin 2. PSR layer 4 is formed on the first wiring pattern 10 side, except regions that the solder balls 3 are mounted and the sealing resin 2 is provided, to prevent a deviation in shape of solder ball or a short circuit between solder balls when mounting the solder balls.

Figure 6:
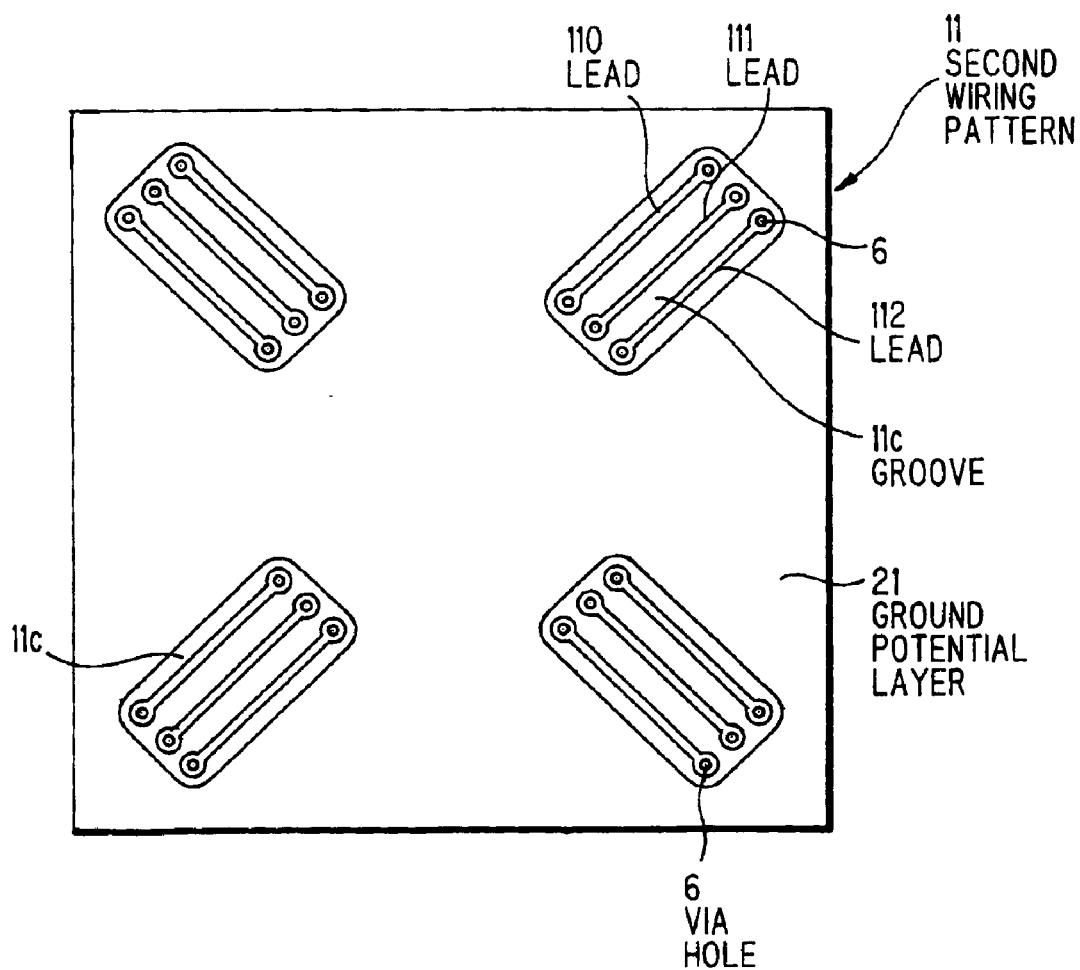
FIG. 6 is a plain view showing a second wiring pattern 11 formed on an insulating tape 5 in FIG. 5.
Figure 7A:
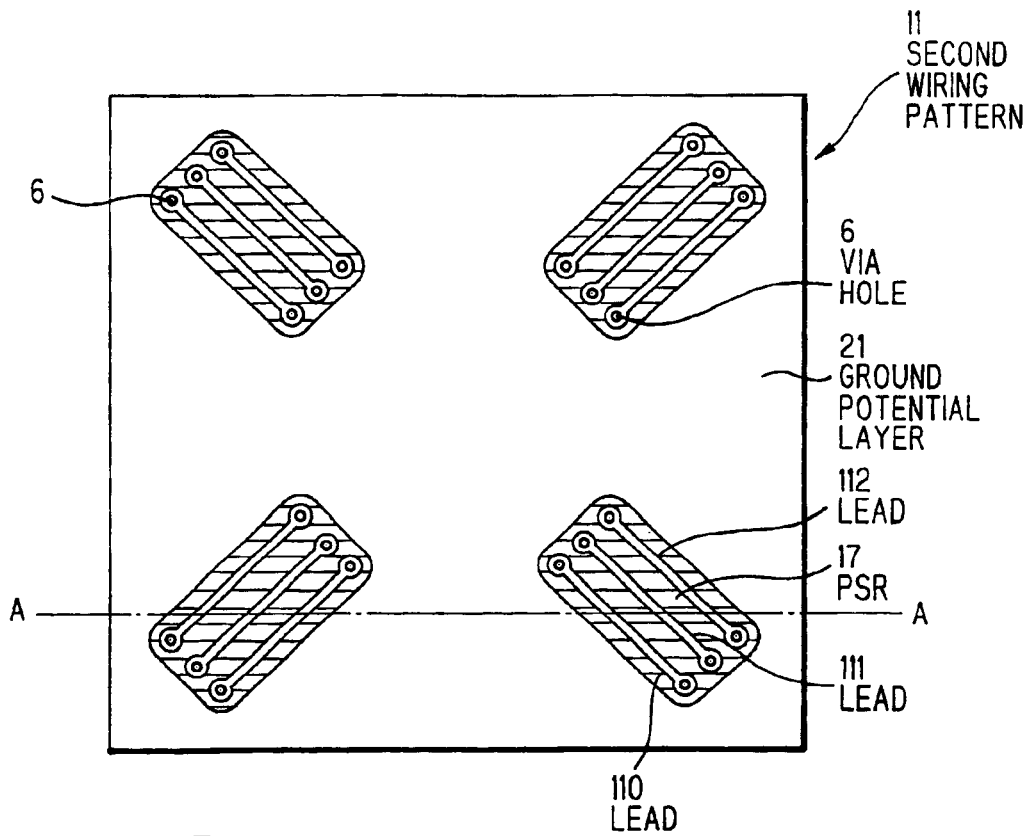
FIG. 7A is a plain view showing the state of PSR 17 filled in regions that no copper layer exists in the second wiring pattern 11.
Figure 7B:
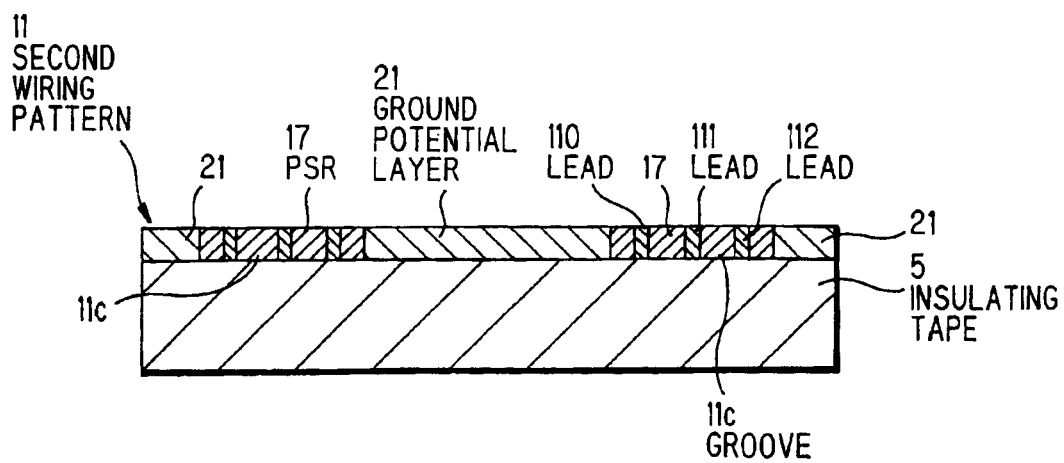
FIG. 7B is a cross sectional view cut along the line A-A in FIG. 7A.

FIG. 6 is a plain view showing the second wiring pattern 11 formed on the insulating tape 5. FIG. 7A is a plain view showing the state of PSR 17 filled in regions that no copper layer exists in the second wiring pattern 11. FIG. 7B is a cross sectional view cut along the line A—A in FIG. 7A.

Although the top surface of leads 110, 111 and 112 forming the second wiring pattern 11 are at the same level as the surface of ground potential layer 21, there are provided grooves 11c, where the copper-plated layer and copper foil are removed by etching, in the regions that no wiring pattern exists around the leads 110, 111 and 112. As described later, the grooves 11c are filled with PSR 17 (FIGS. 7A and 7B) such that the entire surface of the region including the leads 110, 111, 112 and PSR 17 is at the same level as the surface of ground potential layer 21 (FIG. 7B).

This can prevent occurrence of void such as air bubble in adhesive coated when the stiffener 8 is adhered through the adhesive 7 to the surface where the second wiring pattern 11 is formed. In addition, in the reflow of solder ball, peeling of the leads 110, 111 and 112 in the second wiring pattern 11 from the stiffener 8 and migration thereof can be prevented.

Next, a method of making the above tape BGA semiconductor device will be explained.

FIGS. 8A to 8L are cross sectional views showing the process of making the tape BGA semiconductor device with stiffener. The tape BGA semiconductor device obtained by the process is as shown in FIG. 5. In FIGS. 8A to 8L, same numerals are used for the same components as those in FIGS. 2A to 2K.

At first, a copper-covered substrate is prepared that first and second copper foils 10a and 11a are adhered to both surfaces of insulating tape 5 of polyimide film etc. (FIG. 8A). Then, through-holes 6a are formed by punching (FIG. 8B). Both surfaces of the copper-covered substrate with through-holes 6a are copper-plated (FIG. 8C). Via hole 6 is formed that copper-plated layer 6b allows electrical conduction between the first copper foil 10a and the second copper foil 11a, and first and second copper-plated layers 10b and 11b are formed on the first and second copper foils 10a and 11a.

Then, photoresist 14 with a predetermined pattern is coated (FIG. 8D). By conducting the exposure and development, portions where no wiring pattern is to be formed in the first and second copper-plated layer 10b, 11b are exposed (FIG. 8E). The exposed first and second copper-plated layer 10b, 11b and the exposed first and second copper foils 10a, 11a are removed by etching to form the first and second wiring patterns 10, 11 (FIG. 8F).

Photoresist 14 is removed (FIG. 8G). On a suitable place of the first copper foil 10a side, PSR 4 is coated that prevents a deviation in shape of solder ball or a short circuit between solder balls when mounting the solder balls (FIG. 8H).

Then, PSR 17 is filled between wiring layers of the second wiring pattern 11 side and is left only between the wiring layers by conducting the exposure and development (FIG. 8I).

Then, adhesive 7 is coated on the second wiring pattern 11 side (FIG. 8J) A cavity 15 is formed that houses the semiconductor chip (FIG. 8K). The stiffener 8 is adhered to the back surface of the insulating tape 5 (FIG. 8L). Then, by thermally curing the adhesive 7, the TAB tape with stiffener is obtained.

Figure 3A:
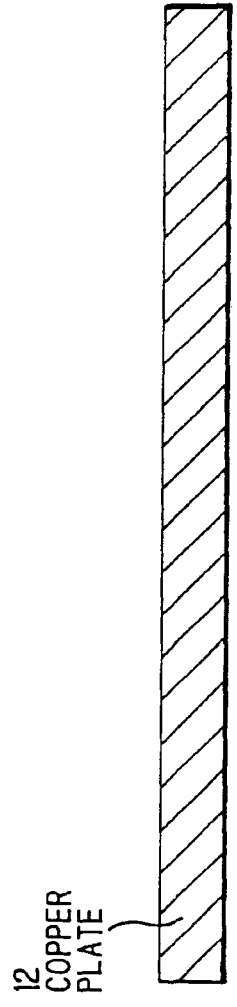
FIGS. 3A to 3C are cross sectional views showing the process of making the stiffener 8 in FIG. 1.
Figure 3B:
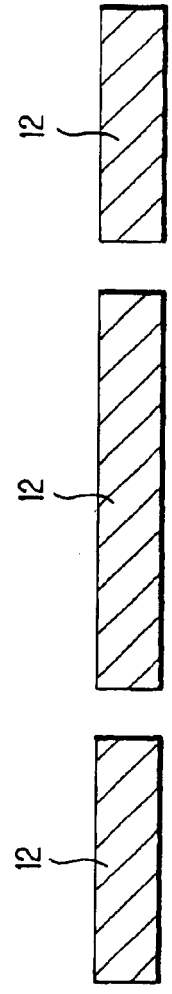
Figure 3C:
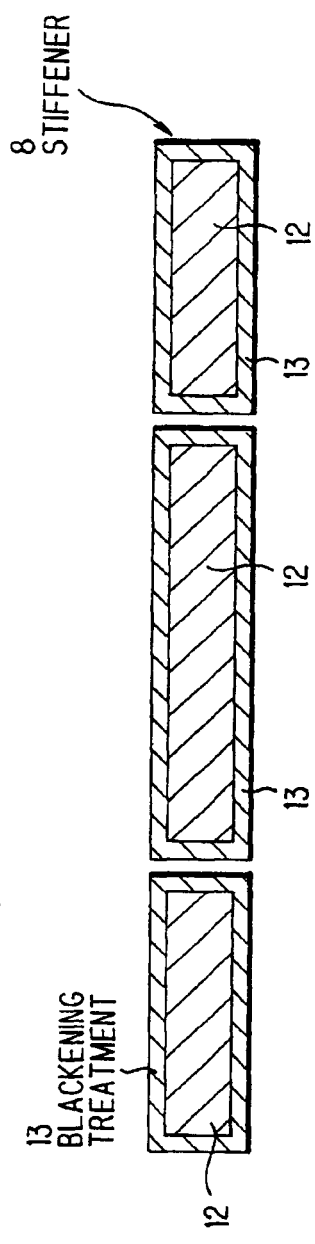
Figures 4A, 4B:
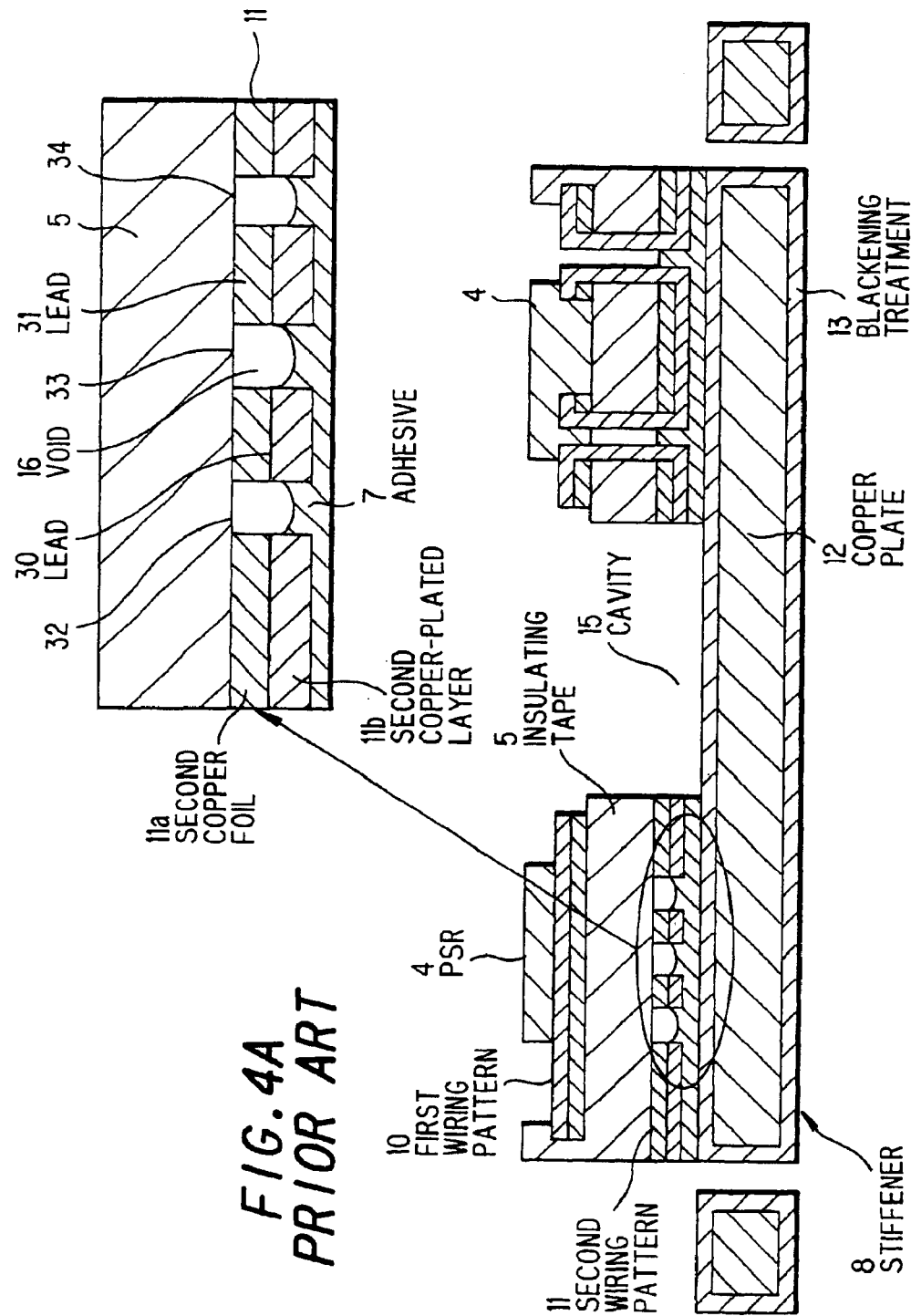
FIG. 4A is a cross sectional view illustrating the problem of the conventional tape BGA semiconductor device with stiffener.
FIG. 4B is an enlarged cross sectional view showing part of FIG. 4A.

The treatment of stiffener 8 is as described earlier referring to FIGS. 3A to 3C, and therefore the explanation thereof is omitted here.

The semiconductor chip 1 is mounted on the stiffener 8 of TAB tape thus obtained on the cavity 15 side. The semiconductor chip 1 is connected through the bonding wires 9 with the first wiring pattern 10. Then, the semiconductor chip 1 and bonding wires 9 are sealed with sealing resin 2.

By mounting solder balls 3 at a predetermined position of the first wiring pattern 10, the tape BGA semiconductor device is obtained.

As described above, although, as shown in FIG. 8F, there are formed the grooves 11c between the leads 110, 111 and 112 to form the second wiring pattern 11 and between the lead 110 or 112 and the ground potential layer 21 when the copper-plated layer and copper foil are removed by etching, the grooves 11c are filled with PSR 17 such that the entire surface of the region including the leads 110, 111, 112 and PSR 17 is at the same level as the surface of ground potential layer 21 (FIG. 7B and FIG. 8I). Therefore, this can prevent occurrence of void when the stiffener 8 is adhered through the adhesive 7 on the surface where the second wiring pattern 11 is formed. In addition, in the reflow of solder ball, the peeling of the leads 110, 111 and 112 of second wiring pattern 11 from the stiffener 8 and the migration thereof can be prevented.

EXAMPLE

A 100 m long tape with wiring patterns 10, 11 on both surfaces is prepared that is made by the process until the step shown in FIG. 8H. On the tape surface to which stiffener 8 is adhered, there are formed the second wiring patterns 11 in the radial direction as shown in FIG. 6. The second wiring pattern 11 has three leads 110, 111 and 112, each of which has a width of 10 $\mu$m and a length of 10 mm, disposed at intervals of 100 $\mu$m. There are provided via holes 6 with a diameter of 100 $\mu$m at both ends of the leads 110, 111 and 112, and electrical conduction is thereby allowed between the first and second wiring patterns 10, 11. 21 is the ground potential layer.

Ink type PSR 17 is, by screen printing, partially filled in the grooves 11c where the leads 110, 111 and 112 and the ground potential layer 21 are not formed. Then, by conducting the exposure and development, PSR 17 is left in the grooves 11c (FIG. 7B).

The viscosity and printed thickness of PSR ink used is controlled such that the thickness of PSR coated is −10 to +20 $\mu$M comparing to the thickness of lead since the thickness of lead is about 30 $\mu$m.

After thermally curing PSR on given conditions, gold plating is conducted simultaneously on both surfaces and adhesive is then laminated on the entire surface on which PSR is coated. The lamination of adhesive is conducted using a roll laminator, at a carrying rate of 1.0 m/min and a roll temperature of 50 to 100° C.

On the other hand, a 100 m long tape (comparative sample) is prepared that has no PSR 17 coated and has laminated adhesive.

The surface with adhesive laminated is observed using an optical microscope at 40-fold magnification. As a result, no void is found between leads in the sample with PSR 17 coated. In contrast, in the comparative sample without PSR 17 coated, voids are observed over the entire length.

Furthermore, samples for another test are prepared by adhering the stiffener 8 to the tape, thermally curing the adhesive. Then, ten seconds infrared reflow at a maximum temperature of 260° C. is three times conducted each for 100 samples in order to simulate the reflow of solder ball. Expansion between leads in PSR formed region is observed by a ultrasonic microscope. As a result, in 95 of 100 samples without PSR 17 coated, some expansion is found. In samples with PSR 17 coated, no expansion is found.

If the thickness of PSR 17 is 10 $\mu$m or more thinner than that of lead, void is apt to generate between leads when laminating the adhesive. If it is 20 $\mu$m or more thicker than that of lead, PSR 17 maybe left on the lead. After that, when adhesive is laminated, stress in laminating concentrates on only portion with PSR left on the lead. Thereby, only this portion becomes thin or PSR being pushed out causes a protrusion on the lead.

In this case, although normal plate-type substrate may be mechanically polished (e.g., buff polishing) to remove it, the tape-type substrate may not be mechanically polished since it will be subject to stretch or undulation.

Therefore, as described earlier, it is suitable that the thickness of PSR coated is −10 to +20 $\mu$m comparing to the thickness of lead.

ADVANTAGES OF THE INVENTION

As explained above, in the TAB tape and the manufacturing method thereof according to the invention, PSR is coated on the region where no copper wiring layer is formed on the surface to which stiffener is adhered so as to make the stiffener adhering surface smooth. Therefore, even when adhesive is laminated thereon, no void is generated. In addition, there occurs neither peeling nor immigration in copper layer due to expansion in the reflow of solder ball.

Similarly, in the semiconductor device using such a TAB tape, there occurs neither peeling nor immigration in copper layer due to expansion in the reflow of solder ball.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A TAB tape comprising:

a tape substrate of insulating material;

a first wiring pattern of conductive material, said first wiring pattern being formed on one surface of said tare substrate;

a second wiring pattern of conductive material, said second wiring pattern being formed on the other surface of said tape substrate;

a conduction Part that allows electrical conduction between said first wiring pattern and said second wiring pattern; and a stiffener that is adhered through adhesive to the other surface of said tape substrate;

wherein said second wiring pattern includes an insulating material filled in a groove region where no wiring pattern is formed around wiring patterns of said second wiring pattern, said insulating material is photosensitive solder resist.

2. The TAB tape according to claim 1, wherein:

said photosensitive solder resist has a thickness of −10 to +20 μm comparing to that of wiring patterns of said second wiring pattern.

3. The TAB tape according to claim 1, wherein:

said photosensitive solder resist is filled in said groove region by screen printing.

4. A method of making a TAB tape comprising the steps of:

forming a first wiring pattern of conductive material on one surface of a tape substrate of insulating material, forming a second wiring pattern of conductive material on the other surface of said tape substrate;

forming a conduction part that allows electrical conduction between said first wiring pattern and said second wiring pattern; and adhering a stiffener through adhesive to the other surface of said tape substrate;

wherein said adhering sten is conducted after filling an insulating material in a groove region where no wiring pattern is formed around wiring patterns of said second wiring pattern, said insulating material is photosensitive solder resist.

5. The method of making a TAB tape according to claim 4, wherein:

said photosensitive solder resist has a thickness of −10 to +20 μm comparing to that of wiring patterns of said second wiring pattern.

6. The method of making a TAB tape according to ciaim 4, wherein:

said photosensitive solder resist is filled in said groove region by screen printing.

7. A semiconductor device comprising:

a tape substrate of insulatina material, said tane substrate including an opening;

a first wiring pattern of conductive material, said first wiring pattern being formed on one surface of said tane substrate;

a second wiring pattern of conductive material, said second wiring nattern being formed on the other surface of said taue substrate;

a conduction part that allows electrical conduction between said first wiring pattern and said second wiring pattern; and a stiffener that is adhered through adhesive to the other surface of said tare substrate;

a semiconductor chip that is mounted on said stiffener in the opening of said tape substrate;

bonding wires that connect between said semiconductor chip and said second wiring pattern; and sealing resin that seals said semiconductor chip;

wherein said second wiring pattern includes an insulating material filled in a groove region where no wiring pattern is formed around wiring patterns of said second wiring pattern, said insulating material is photosensitive solder resist.

8. The semiconductor device according to claim 7, wherein:

said photosensitive solder resist has a thickness of −10 to +20 μm comparing to that of wiring patterns of said second wiring pattern.

9. The semiconductor device according to claim 7, wherein:

said photosensitive solder resist is filled in said groove region by screen printing.

* * * * *